(12) United States Patent
Ruth et al.

(10) Patent No.: US 10,193,300 B2
(45) Date of Patent: Jan. 29, 2019

(54) COMPACT STORAGE RING EXTREME ULTRAVIOLET FREE ELECTRON LASER

(71) Applicant: Lyncean Technologies, Inc., Fremont, CA (US)

(72) Inventors: Ronald D. Ruth, Stanford, CA (US); Roderick J. Loewen, Redwood City, CA (US); Michael Feser, Orinda, CA (US)

(73) Assignee: Lyncean Technologies, Inc., Fremont, CA (US)

( * ) Notice: Subject to any disclaimer, the term of this patent is extended or adjusted under 35 U.S.C. 154(b) by 0 days.

(21) Appl. No.: 15/438,611

(22) Filed: Feb. 21, 2017

(65) Prior Publication Data

US 2018/0241172 A1    Aug. 23, 2018

(51) Int. Cl.
| | |
|---|---|
| *H01S 3/0959* | (2006.01) |
| *H01S 4/00* | (2006.01) |
| *G03F 7/20* | (2006.01) |
| *H01S 3/09* | (2006.01) |
| *H05H 9/04* | (2006.01) |

(52) U.S. Cl.
CPC ............ *H01S 4/00* (2013.01); *G03F 7/70025* (2013.01); *H01S 3/0903* (2013.01); *H05H 9/048* (2013.01)

(58) Field of Classification Search
CPC .................................................... H01S 3/0903
USPC ............................................................. 372/2
See application file for complete search history.

(56) References Cited

U.S. PATENT DOCUMENTS

| | | | | |
|---|---|---|---|---|
| 3,822,410 A | * | 7/1974 | Madey ..................... | H01S 1/005 359/335 |
| 4,449,219 A | * | 5/1984 | Smith ..................... | H01S 3/0903 372/2 |
| 4,740,973 A | * | 4/1988 | Madey .................. | H01S 3/0903 315/5 |
| 5,060,232 A | * | 10/1991 | Etievant ................ | H01S 3/0903 372/2 |
| 5,477,056 A | * | 12/1995 | Hirota ...................... | H05H 7/06 250/492.2 |
| 5,960,013 A | * | 9/1999 | Sheffield ............... | H01S 3/0903 372/2 |

OTHER PUBLICATIONS

LCLS-II ("FEL physics", Apr. 8, 2011).*
LCLS-II, "Conceptual Design Review", FEL physics, Apr. 8, 2011.
Author Unknown, "Requirements on Electron Beam Quality", Helmholtz Research for Grand Challenges, 2018.
(Continued)

*Primary Examiner* — Tod T Van Roy
(74) *Attorney, Agent, or Firm* — Van Pelt, Yi & James LLP

(57) ABSTRACT

A high power extreme ultraviolet (EUV) beam is produced. An electron beam is injected in a compact electron storage ring configured for emission of free-electron laser (FEL) radiation. The electron beam is passed through a magnetic undulator on each of a plurality of successive revolutions of the electron beam around the compact electron storage ring. The electron beam is induced to microbunch and radiate coherently while passing through the magnetic undulator. A portion of the free-electron laser radiation at an extreme ultraviolet wavelength produced by an interaction of the electron beam through the magnetic undulator is outputted.

21 Claims, 7 Drawing Sheets

(56) References Cited

OTHER PUBLICATIONS

Mark Lapedus, "Semiconductor Engineering: EUV's New Problem Areas", Mar. 19, 2018.
Stoner et al., "Spectroscopy: X-Ray and Radio-Frequency Spectroscopy", from Britannica Online Encyclopedia. Jun. 8, 2018.

* cited by examiner

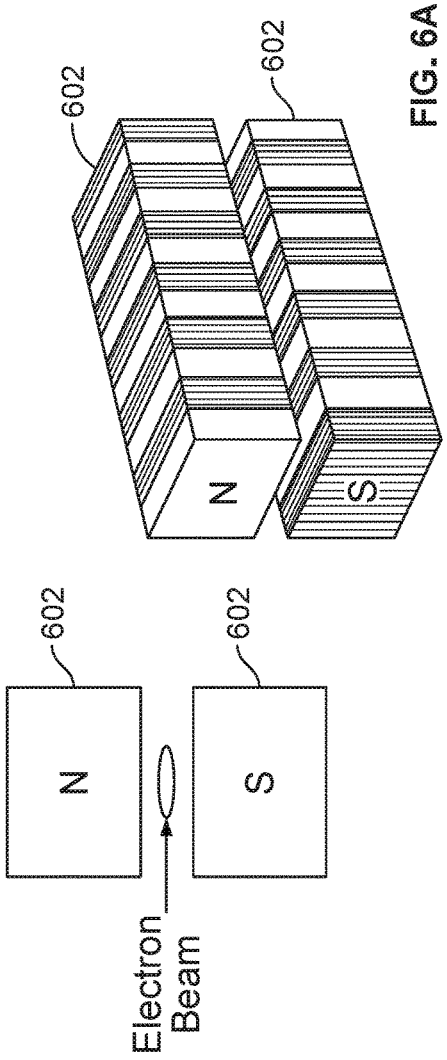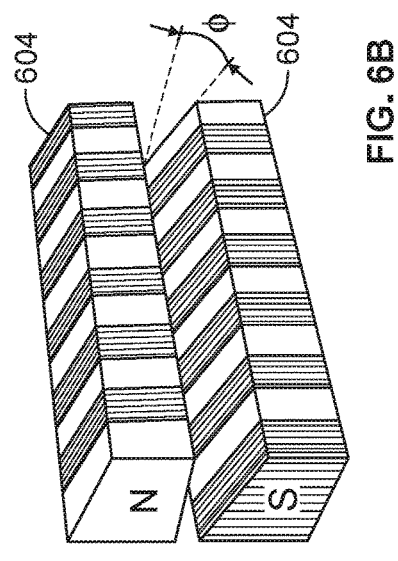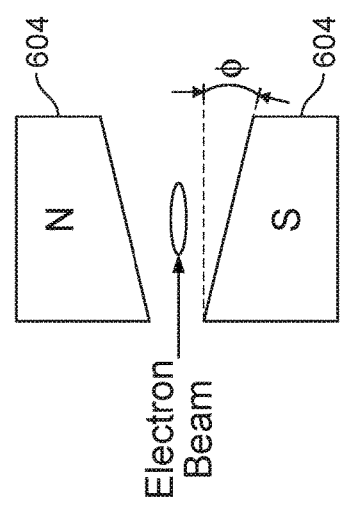

COMPACT STORAGE RING EXTREME ULTRAVIOLET FREE ELECTRON LASER

BACKGROUND OF THE INVENTION

The production of upcoming generations of semiconductor circuits for a broad range of applications will require the next generation of lithographic tools which utilize extreme ultraviolet (EUV) lithography. There has been much development using plasma based sources to reach the 100 W scale in terms of usable EUV power and efforts are under way to reach 250 W of usable power, but it is unclear if this level can be achieved reliably using the plasma based technology. The low usable EUV power poses significant challenges in terms of demands for ultra-sensitive photoresists leading to shot noise induced roughness and limitations of high wafer throughput. EUV sources that produce higher power (e.g., an average power in the range of 1 kW to 3 kW) would address the current challenges for EUV lithography and provide a viable path for high volume manufacturing at smaller node sizes, which is currently unattainable with plasma-based sources. Thus, there exists a need for practical high power EUV source.

BRIEF DESCRIPTION OF THE DRAWINGS

Various embodiments of the invention are disclosed in the following detailed description and the accompanying drawings.

FIGS. 6A-6B are diagrams illustrating embodiments of magnetic undulator insertion devices used to produce FEL radiation.

DETAILED DESCRIPTION

Figure 1:
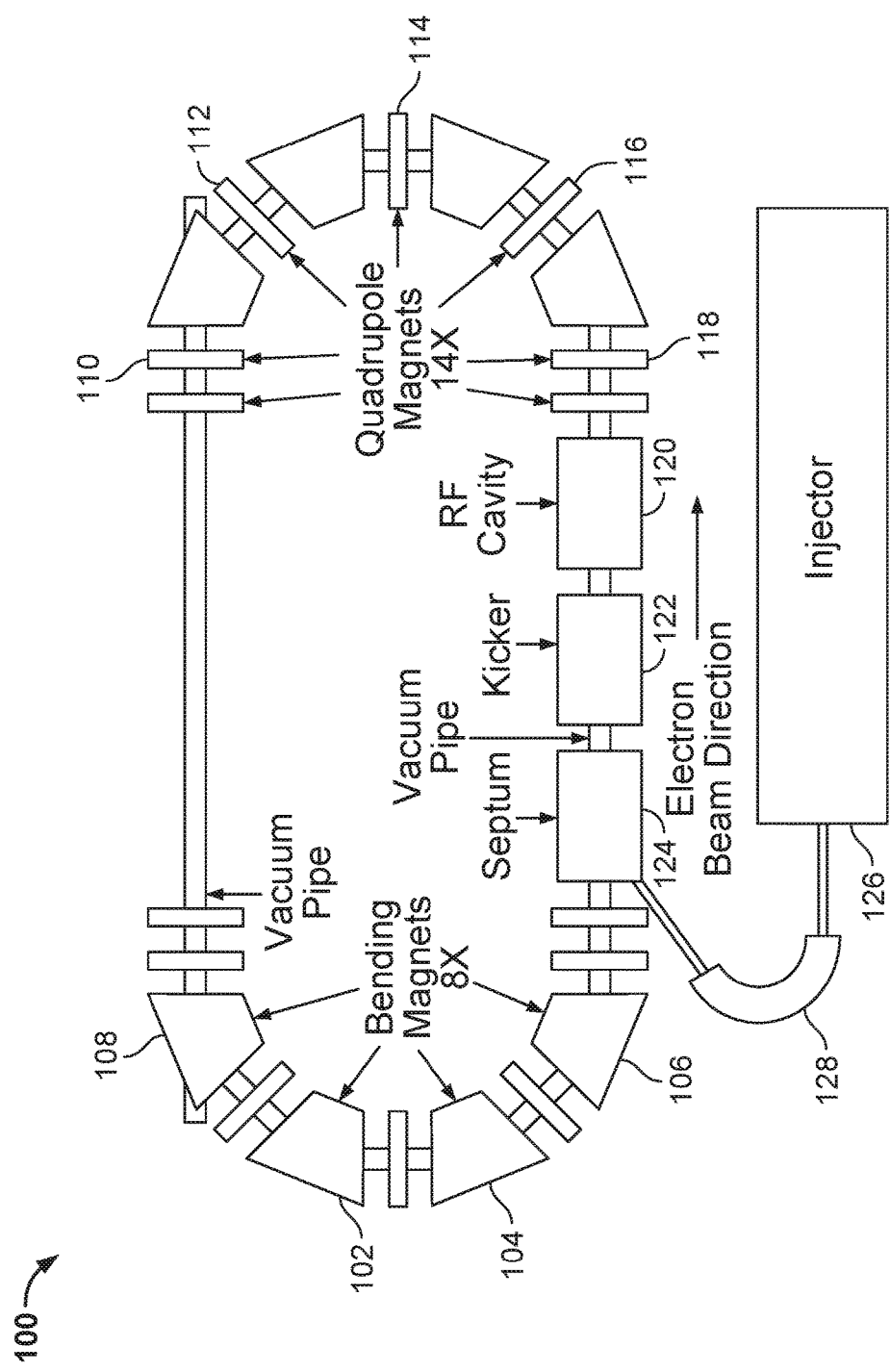
FIG. 1 is a diagram illustrating an embodiment of a compact electron storage ring configured to accept an insertion device suitable for a free-electron laser (FEL).

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Producing a high power EUV beam is disclosed. In some embodiments, the system includes a compact and/or low-energy electron storage ring configured for emission of free electron laser (FEL) radiation. In some embodiments, the compact electron storage ring has a circumference that is on the order of 30 meters. For example, compact electron storage ring fits inside a 60 square meter area. In some embodiments, the compact electron storage ring has a circumference that is at least 10 meters but less than 60 meters. In some embodiments, the energy of the electron storage ring is less than 500 MeV. The use of the compact/low-energy electron storage ring allows for a significant reduction in the size of the system as compared to other high power EUV beam sources. The reduction in size allows associated financial costs to be reduced and allows the system to be installed in a wider type of environments, including under a floor of a semiconductor fabrication facility. The system further includes an electron injector configured to output an electron beam into the compact electron storage ring and a magnetic undulator (e.g., magnetic undulator insertion device consisting of one or more discrete undulator magnets) configured to allow the electron beam to pass through the magnetic undulator. The magnetic undulator may include a plurality of undulators (e.g., the magnetic undulator includes a plurality of different component magnetic undulators). An exit aperture is configured to output at least a portion of the FEL radiation at an EUV wavelength produced by an interaction of the electron beam through the magnetic undulator device. Miniaturization of the high power EUV beam source through the use of the electron storage ring is enabled by various system aspects and inventions. Examples of aspects that differ substantially from prior and standard conventions in the field of FEL design include: an undulator K parameter that is less than 1, an electron beam emittance that is greater than $\lambda_{FEL}/4\pi$, operation of the EUV FEL in the exponential gain region of an FEL gain curve (i.e., not in the saturation region), and/or keeping EUV output power below 10% of the FEL saturation power, as described further in the specification.

Free electron laser (FEL) based sources, using various extensions of FEL techniques can be utilized to produce high usable EUV power. FEL schemes use the property that a magnetic undulator (e.g., periodic structure of alternating poles of magnets) acts upon a relativistic electron beam to produce electron micro-bunches that coherently radiate, substantially increasing the radiated power compared to conventional incoherent undulator radiation.

In some embodiments, a self-consistent FEL is utilized rather than utilizing a "phase-merging enhanced harmonic generation" FEL, a proposal where an electron beam is bunched with a "modulator" undulator then afterwards converted through a dispersive section (e.g., where it can interact more efficiently with a "radiator" undulator to emit harmonic radiation). For example, much like a klystron rather than true FEL, phase-merging enhanced harmonic generation induces an energy modulation on an electron beam before inducing it to radiate (e.g., using two separate undulators). A self-consistent FEL has an insertion device that provides a mechanism to both microbunch and coherently radiate within the same device (e.g., concurrently in a single undulator magnet device).

Typically to generate FEL in prior approaches, a new relativistic electron pulse is created for each FEL interaction in a linear accelerator (LINAC) where the electron pulse must be very well conditioned to produce FEL radiation (e.g., low electron-beam emittance and energy spread). These FEL sources produce high peak power radiation flashes with a repetition rate of the LINAC and with the sequence of bunches within each pulse of the LINAC. However, to achieve high average power, high repetition rates are required, necessitating a superconducting LINAC and associated very high capital cost and high power consumption. Typically these LINACs are physically too large for installation in semiconductor fabrication plants for use in photolithography without significant changes to the construction or layout of the entire facility.

In some embodiments, instead of implementing the FEL in a linear geometry following a LINAC, the FEL is incorporated within an electron storage ring to make efficient use of the electron bunches without the need to generate and accelerate new electron bunches for every pass through the FEL undulator. For example, the electron bunches circulate in a storage ring and traverse the FEL undulator periodically and continuously without the need to regenerate the electron bunches for every FEL undulator interaction.

However, the emission of incoherent synchrotron radiation from a conventional weak undulator in a storage ring does not produce sufficient power for EUV applications. For example a 330 MeV electron storage ring with a 7 m long undulator produces only a few watts of incoherent power in the full spectrum with a single bunch. When this is filtered down to 2% BW at 13.5 nm, which is required for EUV application, the power is less than one Watt average power. Adding more bunches to the storage ring can linearly increase the radiated power which may achieve an average power significantly exceeding one Watt. However, this is far below the necessary power for EUV lithography applications. Increasing the magnetic field of the undulator increases the incoherent radiated power but also increases the bandwidth of the output power so this is not an efficient path to reach high output power in a narrow spectral bandwidth. On the other hand, the energy stored within the electron bunch is very substantial. For example, a 330 MeV electron bunch with 2.5 nC of charge in a storage ring has on the order one joule of stored energy. With a repetition rate (revolution frequency of the storage ring) of order 10 MHz, the average circulating power is on the order of 10 MW. With only 10 bunches, the circulating power is on the order of 100 MW. Therefore, if the FEL mechanism extracts just 0.001% of the power at EUV wavelength, it would yield, as an example, 1 kW of EUV power.

Although typical large electron storage rings are hundreds of meters in circumference, in some embodiments, a compact low-energy electron storage ring is utilized. For example, a compact electron storage ring with a circumference that is on the order of 30 meters is utilized. In some embodiments, the compact electron storage ring has a circumference that is at least 10 meters but less than 60 meters. In some embodiments, the energy of the electron storage ring is less than 500 MeV. The compact electron storage ring implementation achieves a 1 kW to 3 kW (or higher) average power EUV source, which is more compact, affordable and has a lower operating cost, than prior art LINAC-based proposals, suitable for application in semiconductor fabrication or other applications requiring high average power. In some embodiments, the use of a storage ring substantially increases the interaction rate (to >10 MHz) for a circulating pulse to radiate power through multiple passes in a single magnetic undulator by many orders of magnitude.

The utilized storage ring meets the FEL emission conditions for the selected undulator with its equilibrium parameters and the coherent radiation is extracted in such a manner that the electron bunch in the ring can be stored in steady-state operation without detrimental change in its equilibrium properties. For example, the storage ring satisfies the requirement of storing the electron bunch with a beam quality (emittance) and relative energy spread which are low enough and beam charge high enough to enable FEL radiation generation in the undulator both initially and in the steady state operation during FEL emission. In some embodiments, the requirements on the emittance of the electron beam may be significantly relaxed compared to LINAC based EUV FELs.

In some embodiments, a compact low-energy electron storage ring is combined together with a short period undulator (e.g., 1 cm), which is operated so that it emits FEL radiation at EUV wavelengths (e.g. 13.5 nm). The generation of FEL radiation typically has required a sufficiently low emittance electron beam with a sufficiently low relative-energy spread. In some embodiments, the value required for the emittance may be substantially larger than what was traditionally required for prior approaches. Prior EUV FEL designs operate in the power saturation regime, which as a consequence increases the relative energy spread and degrades substantially the required low emittance of the electron beam, thus requiring that the electron bunch be used only once and then discarded or decelerated in a controlled way to recover a portion of its energy and cost. However, when utilizing at least some of the embodiments described herein (e.g., an FEL within a compact storage ring), this emission may be limited far below saturation to substantially preserve the low energy spread and electron beam emittance, but at the same time deep in the amplification regime of the FEL process to harness significantly more power than the incoherent emission from the same undulator. The electron bunch is stored at an equilibrium energy of, for example, 330 MeV. At each circulation of the beam, it passes through an undulator and emits EUV radiation after an FEL gain of many gain lengths, for example 7 gain lengths, which yield about a factor of 1000 gain. The gain length is the physical length of the undulator device for which the EUV output power increases by a factor of e (Euler's number) in the exponential gain regime (linear in lin/log plot). The output power is purposely kept below the natural saturation power of the FEL. For example, the output may be 10% or less of the saturation power.

The lost energy is restored by the RF accelerating system of the storage ring (e.g., analogous to the restoration of the energy lost due to incoherent radiation). Because the electron bunch is continually stored in the storage ring, there is no other energy lost except that due to the typical incoherent synchrotron radiation and the additional incoherent EUV radiation. The beam emittance and energy spread reach an equilibrium state controlled by the natural and induced radiation emission of the storage ring which is restored by the RF accelerating system thereby maintaining a constant energy of the electron beam.

In a free electron laser (FEL) an electron beam is passed through an undulator magnet which causes emission of electromagnetic radiation at the characteristic wavelength of the undulator, $\lambda_{FEL}$, given by following equation.

$$\lambda_{FEL} = \frac{\lambda_u}{2\gamma^2}\left(1 + \frac{K^2}{2}\right)$$

where $$K = \frac{eB_0\lambda_u}{2\pi m_e c} \cong 0.934 B_0[T]\lambda_u[cm]$$

and $\lambda_u$ is the undulator wavelength, $\gamma$ is the ratio of the electron total energy to the electron rest energy, e is the electron charge, $B_0$ is the magnetic field, $m_e$ is the mass of the electron and c is the speed of light. K is the undulator parameter K. The square brackets enclose the units used for the numerical formula.

A magnetic undulator includes of a series of bending magnets that alternate in sign with a wavelength of $\lambda_u$, which cause an electron beam to oscillate in an approximately sinusoidal fashion as it passes between the poles. The oscillating electron beam emits synchrotron radiation or undulator radiation incoherently when passing through the undulator. Typical prior undulators for FELs have had been designed with an undulator parameter K that is greater than 1. However, in at least some of the described embodiments, an undulator parameter K of less than one (e.g., substantially less than 1) is utilized.

The gain of a FEL depends upon the parameters of the electron beam and the undulator. The gain length may be calculated by computer simulations or by the use of calculations which take into account three dimensional effects. In cases where 3D effects start to be important, the gain length is increased. However, as an example, the one dimensional power gain length LG is given by following equation, $$L_G = \frac{\lambda_u}{4\pi\sqrt{3}\,\rho}$$

where $\lambda_u$ is the period of the undulator, and $\rho$ is the Pierce parameter.

Prior FEL designs have traditionally imposed various restrictions on parameters, including that: (1) the relative energy spread within the bunch being less than $\rho$, and (2) the emittance of the bunch being less than $\lambda_{FEL}/4\pi$. The restriction of item (1) is important in that the FEL saturation occurs when this condition is satisfied at the end of the gain process. However, this condition may be alleviated by the utilization of the Transverse Gradient Undulator as discussed herein in order to fulfill the condition locally within the undulator. In this way the steady state relative energy spread may be significantly larger than $\rho$. The restriction of item (2) is relaxed in at least some of the described embodiments with proper design of the 3D FEL. A 3D FEL design process is utilized in order to arrange the conditions for FEL emission.

Example parameters for a FEL electron storage ring optimized for 13.5 nm output is shown in the following Table 1. The parameters have been specifically selected so that the storage ring optimization permits the inclusion of an undulator or undulators for the purpose of use with one or more of the described embodiments. The prior designs typically only take into account incoherent emission. In the case of a storage ring with an integrated FEL, the system provides for additional energy lost by the FEL action by supplying more RF power to the ring. In addition, the system is optimized with the FEL emission as part of the design process. For example, the undulator is sufficiently long to provide sufficient FEL gain on each pass of the bunch through the undulator (e.g., such gain could be more than 10 but less than 1000). The length of the undulator may differ depending upon the embodiment. Gain is also influenced by the storage ring in that the system produces an equilibrium emittance that is sufficiently small in both transverse degrees of freedom. The system produces a relative energy spread that must be of order or less than the FEL $\rho$ parameter. The system produces an equilibrium bunch length which is sufficiently small to provide high peak current. The system also produces equilibrium transverse emittances which permit FEL radiation. The focusing of the electron bunch throughout the undulator system is sufficient to provide the necessary electron beam density. As shown in Table 1, the emittance is significantly larger (factor of seven larger than $\lambda_{FEL}/4\pi$) than typically required in prior systems. Due to the larger emittance, gain length in the example will be increased somewhat from prior conventional designs, but the increased gain length may be compensated by suitable adjusting the interaction length as part of the design constraint of the compact storage ring. Additionally, note that undulator parameter K is less than 1 as compared to prior FEL design that require K to be greater than 1. The parameters shown in Table 1 are merely illustrative examples and the parameters in the table may not have been optimized for high average power performance of various embodiments.

TABLE 1

| Overall Gross Parameters | Value |
|---|---|
| Electron Energy, E [MeV] | 330.0 |
| Circumference, C [m] | 23.9 |
| Undulator length [m] | 6.5 |
| Undulator period [cm] | 1.0 |
| Undulator Parameter (K) | 0.5 |
| Electron Bunch Charge [nC] | 2.0 |
| Electron Bunch length (rms) | 2 mm |
| γ * emittance | 5 micron |
| Relative energy spread | 0.0003 |
| 1-D FEL ρ Parameter | 0.0006 |
| Energy loss per turn, $U_0$ [keV] | 1.9 |
| RF voltage, $V_{RF}$ [MV] | 0.324 |
| RF frequency, $f_{RF}$ [MHz] | 1428 |
| Harmonic number | 114 |

FIG. 1 is a diagram illustrating an embodiment of a compact electron storage ring configured to accept an insertion device suitable for a FEL. Electron storage ring 100 is a compact low-energy storage ring. In some embodiments, electron storage ring 100 has a circumference that is on the order of 30 meters. For example, electron storage ring 100 fits inside a 60 square meter area. In some embodiments, electron storage ring 100 has a circumference that is at least 10 meters but less than 60 meters. In some embodiments, the energy of electron storage ring 100 is less than 500 MeV.

The shown storage ring 100 includes magnetic undulator 202, bending magnets 102, 104, 106, and 108, quadrupole magnets 110, 112, 114, 116, and 118 for beam focusing, and an RF Cavity 120 for replacing energy lost by synchrotron radiation and also to keep the electrons in tight bunches longitudinally. Not all components have been labeled and only a select number of the components have been labeled to illustrate the embodiment clearly. Injector 126 generates electron beams that are bent by bending system 128 (e.g., using one or more magnets) for insertion in the storage ring. Septum 124 receives the electron beam and pulsed kicker magnet (kicker) 122 is used to inject the electron beam into the storage ring. In various embodiments, the use of pulsed kicker magnet 122 is optional.

Injector 126 provides sufficient energy to the electron beam to be injected and stored in the storage ring. The final energy of the injector may be either the design energy or a lower energy which is subsequently increased after storage in the storage ring. The injector may be one of several different types that are familiar to those skilled in the art. In some embodiments, injector 126 includes a linear accelerator (LINAC). In some embodiments, injector 126 includes a LINAC utilized on multiple passes by bending the beam to pass through the LINAC more than once. In some embodiments, injector 126 includes a Microtron. The emittance of the injected beam is not required to be a very low emittance. The injected emittance is sufficiently low so that the beam may circulate enough times in the electron storage ring to come to equilibrium after cooling to the smaller equilibrium emittance sufficient for FEL emission. The injected energy spread does not have to be as low as that in the storage ring which is required for FEL emission. However, the injected energy spread is sufficient to permit the electron beam to circulate enough times in the electron storage ring to come to equilibrium after cooling to the smaller equilibrium energy spread sufficient for FEL emission.

In some embodiments, operation of the storage ring FEL begins by the injection of electrons into the storage ring. In some embodiments, injector 126 creates electron bunches below the energy of the storage ring. In this embodiment, the storage ring is ramped in energy after injection to the desired final energy, for example 330 MeV in the sample parameters shown in Table 1. The operation of the EUV may be off from time to time for injecting the storage ring and reacceleration to the design storage ring energy.

In some embodiments, the storage ring may be injected with an electron beam with an energy that is equal to that desired for EUV operation. In this embodiment, the desired number of bunches may be injected and operation may be commenced thereafter. From time to time' additional electrons may be injected, avoiding the main beam and without disturbing the operation at EUV, for example after the intensity of the electron beam is reduced by several percent. This additional beam cools down to be absorbed into the primary circulating beam. This type of injection is sometimes referred as "top up" or trickle charge injection. The reduction in EUV power may be avoided by utilizing a corresponding increase in the seed power. This may be controlled by a feedback system in order to fulfill stability requirements for EUV output power.

The electrons circulate counter clockwise in storage ring 100. Bending magnets have a dipole magnet field and may have additional quadrupole and sextupole fields. Additional magnets (not shown) include quadrupole (e.g., for focusing which keep the electron beam near a stable orbit that closes after one turn) and sextupole (e.g., used for correcting the chromaticity) magnets. The number of bending magnets 102, 104, 106, and 108, and the angular bend of each adds to a total bending of 360 degrees. The total number, position and strength of bending magnets, quadrupoles and RF cavities may be optimized to achieve the desired parameters of the ring including effects due to the emission of FEL radiation. The parameters may be optimized including 3D FEL effects so that, in particular, the emittance may not be less than $\lambda_{FEL}/4\pi$. The total number, position and strength of septums 124 and kickers 122 may be optimized to achieve the desired injection into the storage ring. The magnetic field may be selected for each magnet so as to create a stable configuration that permits an electron beam to circulate periodically in the steady state. In some embodiments, storage ring 100 includes a sequence of magnets to disperse the electrons laterally according to their energy before entering an undulator.

Electrons which are stored in the storage ring radiate a significant amount of so called 'synchrotron radiation' which also serves to damp the electrons towards this closed stable orbit, which in turn cools the distribution of electrons by decreasing the electron beam emittance. In addition, because of this constant energy loss, RF cavity 120 is provided with sufficient power to replace the energy lost due to synchrotron radiation. This continuous loss and acceleration also serves to damp the electron energy towards the stable periodic orbit, on which the amount of radiation is exactly canceled by the acceleration system. This results in the cooling, or decrease, of the relative energy spread of the beam. In addition to this cooling action, the electron beam is also heated by the emission of discrete photons. The competition between these effects yield Gaussian distributions in the transverse and longitudinal directions. Thus, electron storage ring 100 may be used to optimize the 'emittance' of the beam in both the transverse degrees of freedom, as well as the longitudinal degree of freedom (relative energy spread and bunch length). Typical use of electron storage rings have been traditionally for the production of incoherent x-rays for research applications. However, such prior uses has not been optimized or considered for coherent FEL emission at EUV wavelength. Generally the prior designs based on traditional storage rings will not generate very high average power FEL EUV radiation.

The FEL in the storage ring may be operated in various alternative ways. In some embodiments, radiation is initiated by SASE (Self Amplified Stimulated Emission). In some embodiments, FEL is seeded with an external coherent source at 13.5 nm. In some embodiments, FEL is seeded with an external coherent source that has a multiple of the desired EUV wavelength. In some embodiments, FEL is self-seeded by selecting a small fraction of the output energy of one pulse and then using that energy to seed the next pulse (e.g., regenerative amplifier). The selected fraction of the output energy may be tuned to reach the desired output power.

Figure 2:
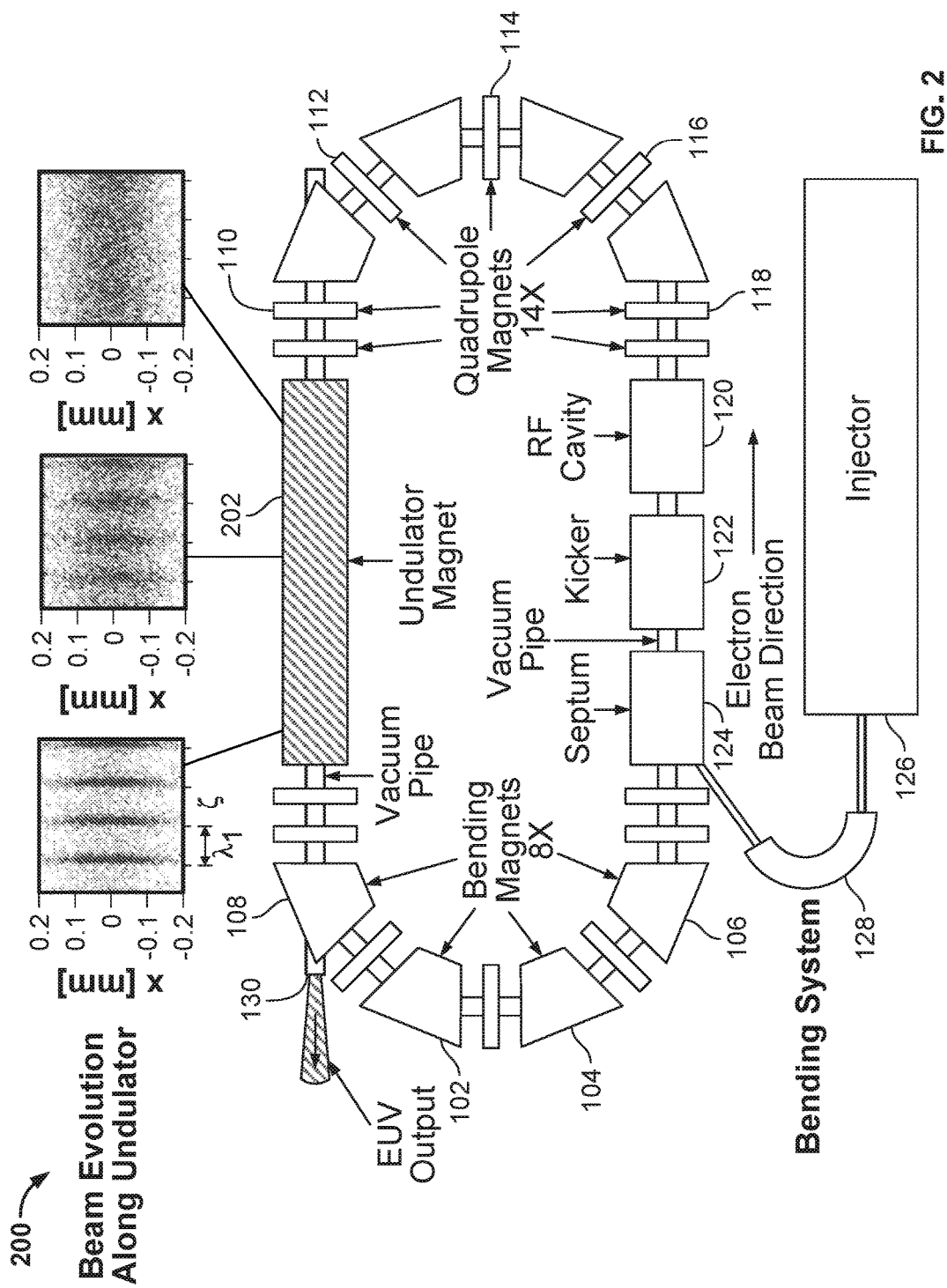
FIG. 2 is a diagram illustrating an embodiment of a Compact Storage Ring high power EUV beam generator system utilizing an undulator magnet insertion device to create FEL radiation initiated by Self Amplified Stimulated Emission (SASE).

FIG. 2 is a diagram illustrating an embodiment of a Compact Storage Ring high power EUV beam generator system utilizing an undulator magnet insertion device to create FEL radiation initiated by Self Amplified Stimulated Emission (SASE). System 200 includes the compact electron storage 100 of FIG. 1 and magnetic undulator 202. Undulator 202 is adjusted in length so that it is long enough (e.g., 12 gain lengths) for SASE to develop. The length of undulator 202 is also adjusted with selection of electron bunch parameters such that the output power is below saturation. The EUV output exiting output aperture 130 includes incoherent undulator radiation and also SASE coherent radiation. The evolution of the bunching due to the FEL is shown in along the undulator. The beam is shown with one transverse position and the longitudinal position. Initially the beam is not bunched and is comprised of a statistical random distribution of particles. After progression along the undulator, the density is starting to be modulated at the wavelength of FEL emission. Finally at the end of the undulator, the bunching is more extreme, but still not yet fully bunched. The FEL is significantly below saturation. After the bunch passes through the undulator it circulates and arrives once again at the beginning. The bunching is fully washed out by the entrance to the undulator due to the variation of the path lengths of the particles as they circulate once in the bending and focusing system.

Figure 3:
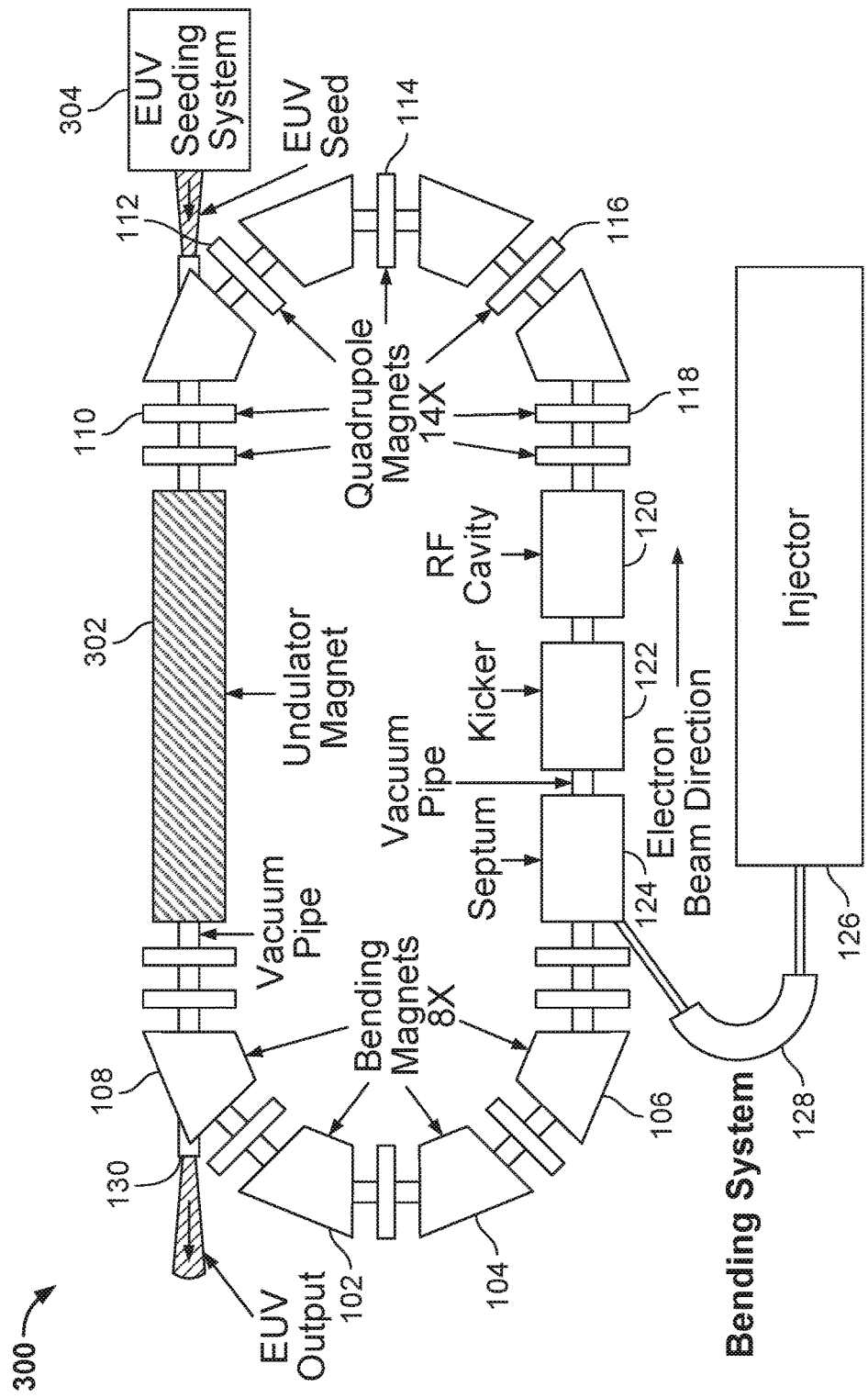
FIG. 3 is a diagram illustrating an embodiment of a Compact Storage Ring high power EUV beam generator system utilizing an undulator magnet insertion device to create FEL radiation seeded with an external coherent source at EUV wavelength or a multiple thereof.

FIG. 3 is a diagram illustrating an embodiment of a Compact Storage Ring high power EUV beam generator system utilizing an undulator magnet insertion device to create FEL radiation seeded with an external coherent source at EUV wavelength or a multiple thereof. System 300 includes the compact electron storage 100 of FIG. 1 and magnetic undulator 302. FEL amplifies coherent EUV light supplied from EUV seed system 304 that generates coherent EUV light. The coherent EUV seed pulse is injected from the right after it is created by the EUV seed system 304. After it traverses undulator 302 and interacts with the electron bunch, it is amplified to emerge on the left and a portion of the amplified EUV exits out output aperture 130. The EUV pulse of seed system 304 is timed appropriately to be superimposed on the electron bunch as they transverse undulator 302. The length of undulator 302 (e.g., about 2 gain lengths plus gain sufficient to reach a sufficient power for operation, for example 10% of the FEL saturation power) does not have to be as long as undulator magnet 202 of FIG. 2 due to the externally supplied coherent EUV light. A larger seed power results in a shorter undulator length required for power production. For example, if a power of 1 kW is desired, then a gain of 1000 (e.g., seven gain lengths) is desired, provided that 1 W of coherent EUV average power is used to seed the FEL. In this case, the total gain length required is 9 gain lengths which may include 2 gain lengths to form the microbunching (lethargy) and an additional 7 gain lengths to provide a factor of 1000 power increase.

Figure 4:
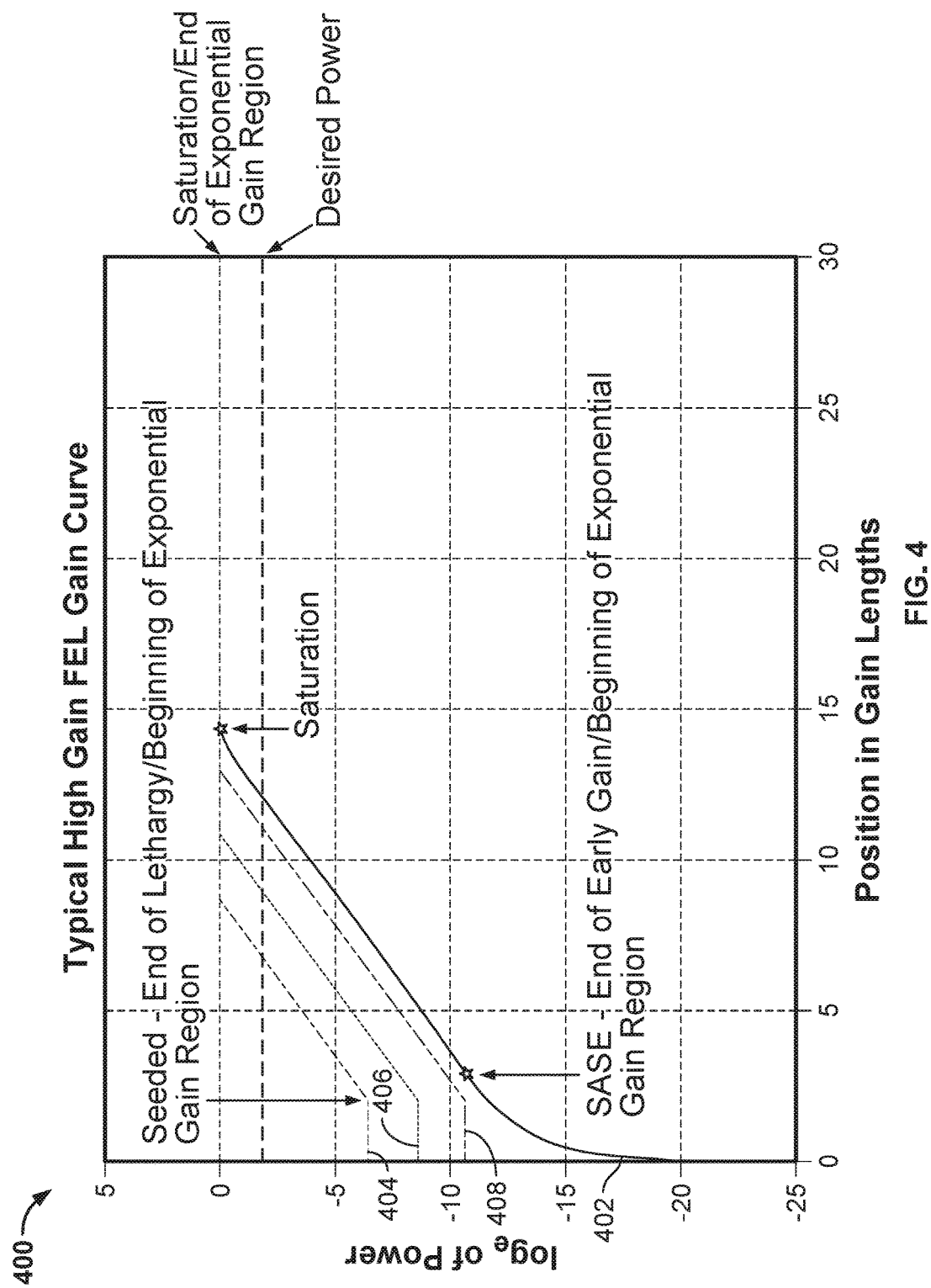
FIG. 4 is a graph illustrating example gain curves for different seeding power levels in which the FEL output power increases as a function of position in an undulator.

FIG. 4 is a graph illustrating example gain curves for different seeding power levels in which the FEL output power increases as a function of position in an undulator. The co-propagating emitted radiation may cause bunching of the electron beam at the emission wavelength. This in turn can induce further emission due to the coherent emission of the bunched beam. This process can grow exponentially with a characteristic gain length until the energy lost is approximately equal to the FEL ρ parameter, after which the emission saturates. Graph 400 shows example typical gain curves for FEL power increase as a function of position in the undulator. For SASE radiation (e.g., generated using system 200 of FIG. 2), as shown by curve 402, there are three regions, early gain, exponential (high) gain and finally saturation. For seeded operation (e.g., generated using system 300 of FIG. 3), three curves (i.e., 404, 406 and 408) are shown corresponding to different seed power to illustrate the process of seeding. There is an initial delay, called lethargy (e.g., during which the beam is forming microbunches) before the onset of the exponential (high) gain due to the process of bunching prior to saturation. This delay is about 2 gain lengths, after which the power grows exponentially according to $e^x$ where x is the distance measured in gain lengths. The dashed line represents a desired power in the exponential gain regions of curves 402-408, below the saturation.

In the case of an FEL within a storage ring, the electron beam passes through the undulator each time that it circulates around the ring. Therefore, if there is only one bunch of electrons stored in the ring the pulses of EUV light are produced at the revolution frequency of the storage ring which is typically of order 10 MHz. In addition, if there are many bunches in the storage ring, then pulse pattern of emitted radiation follows the pattern of the bunches around the storage ring and repeats with a frequency of the revolution frequency. If the EUV average power desired is 1 kW, then the energy emitted in the form of EUV radiation caused by the FEL action on each turn is 100 micro joules based on a revolution frequency of 10 MHz. If there are 10 bunches within the ring, then the amount of energy extracted from each bunch would be correspondingly lower, 10 micro joules for the case considered above. For an example ring of the appropriate energy, the typical stored energy of each bunch is of order 1 joule. Therefore, in the given example, the necessary extracted energy is 10 to 100 parts per million of the energy stored in the ring on each turn.

Figure 5:
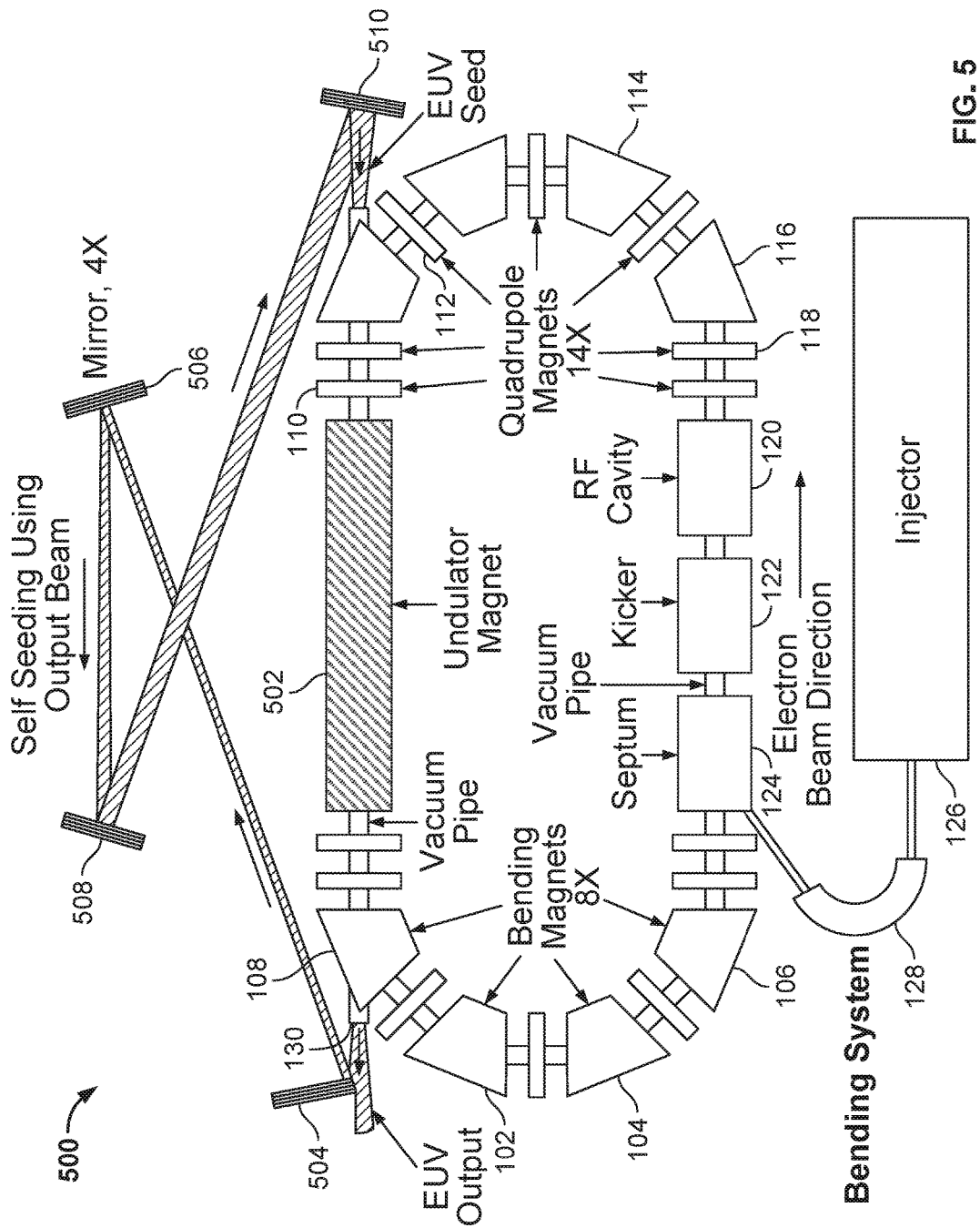
FIG. 5 is a diagram illustrating an embodiment of a Compact Storage Ring high power EUV beam generator system utilizing a regenerative self-seeded FEL.

FIG. 5 is a diagram illustrating an embodiment of a Compact Storage Ring high power EUV beam generator system utilizing self-seeded regenerative amplifier FEL. System 500 includes the compact electron storage 100 of FIG. 1 and magnetic undulator 502. The length of undulator 502 is long enough to permit amplification of the self-seeded pulse. As shown in the Figure, a portion of the output of the EUV FEL itself is isolated and fed back into the undulator 502 to act as a seed (e.g., instead of using a separate seed system). The EUV output of system 500 exiting output aperture 130 includes incoherent undulator radiation and also coherent radiation amplifying the seed pulse. Note that the seed pulse overlaps the electron beam. To seed the same bunch which created the seed, the total delay of the seed is equal to a multiple of the revolution time of the electron beam. For example, if the delay is two times the revolution period, then the even revolutions are seeded by even revolutions and the odd revolutions are seeded by odd revolutions (e.g., the first revolution seeds the third revolution which seeds the fifth revolution etc. and similarly with the second revolution, the fourth and the sixth, etc.). Mirrors 504 reflects a portion of the EUV FEL output and this reflected portion is reflected on mirrors 506, 508 and 510 to be fed back into the storage ring. For example, if the gain is 1000, and if one percent is circulated back to seed the FEL, then on the next cycle the radiation seed gets amplified by 1000 and the total round trip output is increased by a factor of 10. Multiple mirrors are utilized to increase the length of distance traveled by the reflected beam within a compact physical space. By adjusting the distance traveled by the reflected beam, the total time delay of the reflected beam is controlled. In order for the seed power to selectively seed the same bunch which created it, the total time delay of the mirrors to provide the EUV seed equals an integer multiple of the revolution time of the electron bunch. The mirrors shown in FIG. 5 are merely illustrative examples. In various embodiments, different number of mirrors, mirror geometries and/or other mirror configurations may be utilized.

In the embodiment shown in FIG. 5, to avoid power saturation due to increasing power with each pass through the undulator magnet, the fraction of radiation power returned for the seeding may be adjusted to a value equal to the inverse of the gain of the FEL to operate the FEL in the steady state condition. In some embodiments, a feedback system is utilized to control the output power so that it is well below the saturation power of the FEL. This may be accomplished by the attenuation or enhancement (e.g., adjust intensity) of the fraction of seed power, which is inserted at the beginning of the FEL (e.g., the intensity of the seed is adjusted to maintain the inverse relationship in which the fraction of seed power is equal to the inverse of the total gain of the FEL). Alternatively, properties of the electron beam may be altered during operation to modify the amount of gain in the FEL in order to control the output power, so that it is below the saturation power of the FEL (e.g., parameters of the electron beam are adjusted to maintain the inverse relationship in which the fraction of seed power is equal to the inverse of the total gain of the FEL so as to reach steady state). Alternatively, the properties of the electron beam may automatically reach an equilibrium state producing constant output power (e.g., the inverse relationship, in which the fraction of seed power is equal to the inverse of the total gain of the FEL so as to reach steady state, evolves automatically by evolution of the parameters of the electron beam). The specific total output power desired may be adjusted by adding or reducing the number of bunches in the storage ring. In the example shown in Table 1, the number of bunches may range from 1 to 114. Therefore, the output power could be adjusted over a range of a factor of 114. For example, if the average FEL output power for one bunch were 30 W, then the average power could range from 30 W with one bunch to 1200 W with 40 bunches to 3420 W with 114 bunches. In some embodiments, the average power may be selected to the appropriate level desired by the selection of the number of electron bunches stored in the storage ring. In some embodiments the bunch to bunch stability may be maintained by the use of bunch by bunch feedback system.

In some embodiments, with the use of SASE, the output power of the FEL may fluctuate and the coherence of each pulse is independent so that on the average the illumination will not show coherent effects provided that it is accomplished on multiple cycles of the storage ring. In some embodiments, with the use of the external seed generation system, the coherence of the output follows that of the seed. In some embodiments, with the use of self-seeding, the output may develop a single coherent phase, which could lead to undesirable interference effects in the EUV lithography application. Coherent effects in the utilization of the EUV beam may be altered and eliminated by the utilization of a variation of the total length of the seed return path by of order one wavelength at times scales which are short compared to an illumination time. For example, if the illumination time is one second, the path length may be oscillated by more than one wavelength with a frequency of 1 kHz so that any fringe effects are averaged over 1000 cycles. In some embodiments, length of seed of the external seed generation system may be likewise varied to alter the phase of the seed pulse. Alternatively, an optical system after the EUV output of the source can be designed to modify beam parameters.

FIGS. 6A-6B are diagrams illustrating embodiments of magnetic undulator insertion devices used to produce FEL radiation. FIG. 6A shows a profile view and side view of top and bottom portions of magnetic undulator 602. FIG. 6B shows a profile view and a side view of top and bottom portions of transverse gradient magnetic undulator 604. A plurality of Magnetic undulator 602 or magnetic undulator 604 may be included in any of magnetic undulator 202, 302 and/or 502 of FIGS. 2, 3 and 5, respectively. Magnetic undulator 602 creates alternating vertical magnetic fields that produce a sinusoidal horizontal deflection in the example shown. The undulator may be oriented to bend vertically or horizontally. For example, rather than having top and bottom portions in a vertical configuration that bend a beam horizontally, the undulator may be configured in a horizontal configuration with left and right portions that bend a beam vertically. The poles may be shaped to influence the quadrupole field within the undulator.

The FEL emission has the most significant effect on the energy distribution within the electron bunch. At each wavelength of 13.5 nm, the emission induces a shifted sine wave much smaller that the natural energy spread. If this process induces an additional energy spread, even though the emission is far below the saturation level, then the equilibrium energy spread of the storage ring may be increased. For example, if the natural energy spread is $2\times10^{-4}$ and the FEL $\rho$ parameter is $6\times10^{-4}$, then FEL emission will take place. However, if this energy spread grows beyond $6\times10^{-4}$ as the system reaches equilibrium, then the FEL gain will be reduced on subsequent revolutions of the electron bunch or the FEL may have an equilibrium output from each bunch that is reduced. This effect may be compensated by the use of transverse gradient magnetic undulator 604 of FIG. 6B which has a transverse gradient in the deflecting field. Undulator 604 has a variation of the undulator parameter transversely caused by tilting the poles of the undulator. This variation can be automatically matched to the increased energy spread by having a fixed dispersion of transverse beam position proportional to the energy within the undulator. In other words, electrons with different energies will automatically enter the undulator at different transverse positions such that the conditions for coherent emission is maintained along the path through the undulator. Thus, the FEL resonance condition can be maintained in spite of increases in the energy spread within the electron beam, even at steady-state.

The tipping angle of the poles produces a linear dependence of the vertical bending field with the horizontal position x. The change of the field with x depends upon the choice of angle. The poles may be also shaped to influence the quadrupole field in the undulator. In a storage ring the dispersion of the electron beam with energy spread is controlled by the detailed design of the magnet lattice, the sequence and strength of bending and quadrupole focusing magnets. This lattice may be adjusted to provide a dispersion in position with energy spread within the undulator. Alternatively, additional magnets may be used both upstream and downstream of the undulator to provide a dispersion in position with energy spread within the undulator. In either case, this may be used to achieve a matching of the undulator condition of the previously discussed $\lambda_{FEL}$, equation, locally in the dispersed direction. Thus, the equilibrium energy spread may be allowed to exceed the $\rho$ parameter while still achieving EUV FEL emission.

In some embodiments, the undulator magnet insertion device includes a sequence of undulator sections with either spaces or magnets in between them. The spacing of these separate undulator sections may be adjusted so that the FEL action is undisturbed. The spacing of these separate undulator sections may be adjusted to affect the other parameters of the beam so as to improve the performance of the FEL as operated within the storage ring. Such spacing may diminish the output of the FEL in a single pass while improving the overall performance of the system in the steady state. For example, a shift of FEL phase may be included between undulator sections such that the effect of the FEL on the steady state electron beam parameters (e.g., relative energy spread) is decreased or diminished. While this may or may not lead to decreased power emitted by that bunch of the FEL, the overall performance may be enhanced or maintained by increasing the number of bunches or the overall current in the storage ring.

In some embodiments, the electron beam, including a sequence of electron bunches, is steered within the undulator in order to inhibit the emission of EUV FEL radiation temporarily on a sequence of revolutions. For example, such a beam steering may be included such that the effect of the FEL on the steady state electron beam parameters (e.g. relative energy spread) is decreased. For example, the beam is steered on 90% of the revolutions in order to inhibit the emission of FEL radiation, while on the remaining 10% the beam is not steered so that the FEL emission will occur. In this example, to achieve the same output power, the gain of the FEL may be increased by a factor of 10 on those passes that are not steered. During those revolutions where the beam is steered and the FEL emission is suppressed, the electron beam continues to be cooled towards equilibrium values. Such cooling may be advantageous in controlling the steady state values of beam parameters (e.g. the relative energy spread).

Figure 7:
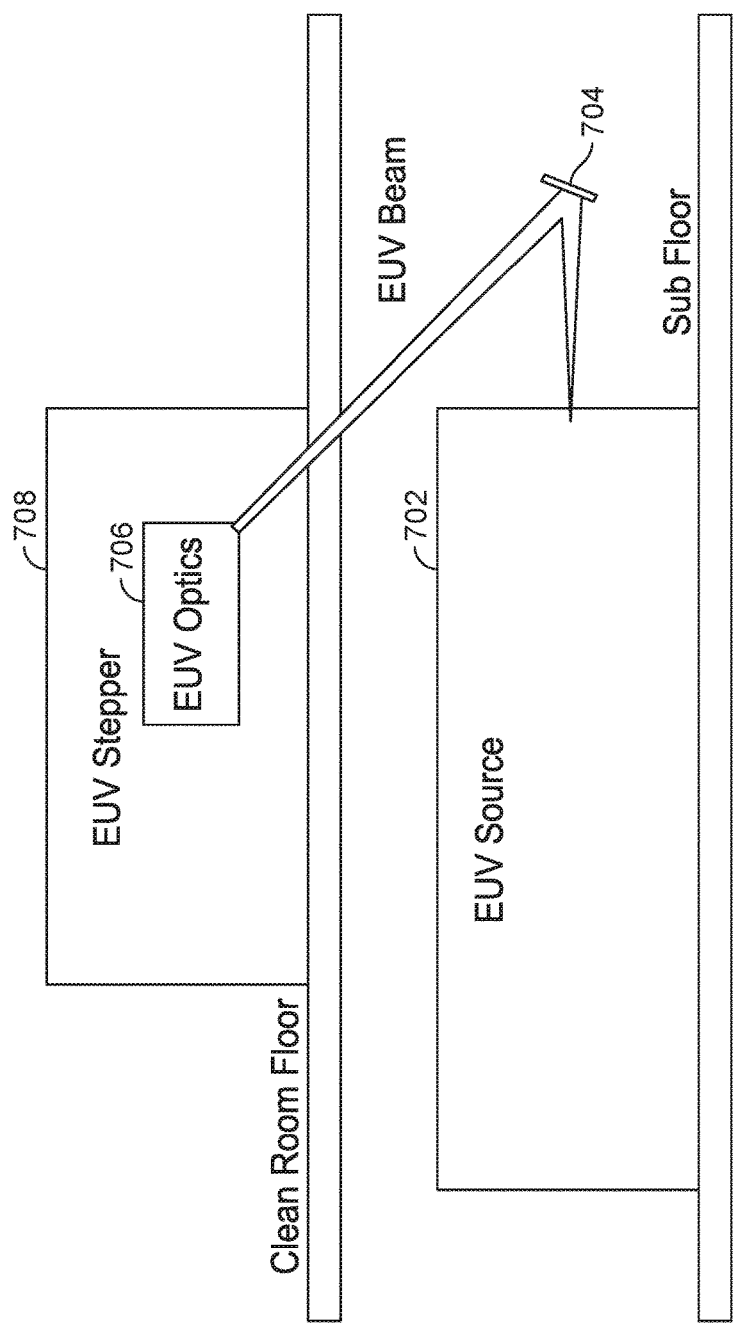
FIG. 7 is a block diagram illustrating an embodiment of a system for performing EUV lithography.

FIG. 7 is a block diagram illustrating an embodiment of a system for performing EUV lithography. EUV source 702 has been installed on a subfloor under a floor of a semiconductor manufacturing facility clean room. The compact size EUV source 702 enabled by the use of a compact storage ring (e.g., compact storage ring 100 of FIG. 1) has allowed EUV source 702 to be small enough to fit within a typically sized semiconductor manufacturing facility. Examples of EUV source included in EUV source 702 include system 200, system 300 or system 500 of FIGS. 2, 3 and 5. The EUV beam output generated by EUV source 702 is reflected by mirror 704 up to EUV optics 706 of EUV lithography system/stepper 708 (e.g., lithography scanner) for use as the light source of EUV lithography. In some embodiments, the same beam output generated by EUV source 702 is provided a plurality of lithography steppers/scanners.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for producing a high power extreme ultraviolet (EUV) beam, including:
   a compact electron storage ring configured for emission of free-electron laser (FEL) radiation, wherein a circumference of the compact electron storage ring is less than 60 meters;
   an electron injector configured to insert an electron beam into the compact electron storage ring;
   a plurality of bending magnets and a plurality of quadrupole magnets interspersed along the compact electron storage ring, wherein at least a corresponding one of the quadrupole magnets is between any two of the bending magnets along the compact electron storage ring;
   a magnetic undulator configured to allow the electron beam to pass through the magnetic undulator where the electron beam is induced to microbunch and radiate coherently, wherein the magnetic undulator is a transverse gradient undulator that includes a plurality of transverse gradient undulator components and each of the transverse gradient undulator components includes a periodic structure of mechanically coupled set of magnetic components with alternating poles that create alternating transverse magnetic fields along at least a portion of a length of the transverse gradient undulator to generate at least a portion of the free-electron laser radiation when the electron beam travels along at least the portion of the length of the transverse gradient undulator, and for each of the plurality of transverse gradient undulator components, the included corresponding mechanically coupled set of magnetic components with alternating poles is uniformly tilted in a transverse direction to a path of the electron beam; and
   an exit aperture configured to output a portion of the free-electron laser radiation at an extreme ultraviolet wavelength produced by an interaction of the electron beam through the magnetic undulator, wherein the output portion of the free-electron laser radiation is provided to a lithography system as a light source for the lithography system and an average power of the output portion of the free-electron laser radiation is greater than 250 W.

2. The system of claim 1, wherein an undulator parameter K of the magnetic undulator is less than 1.

3. The system of claim 1, wherein an electron beam emittance ($\epsilon$) of the system is greater than $\lambda_{FEL}/4\pi$.

4. The system of claim 1, wherein an equilibrium relative energy spread is greater than a FEL $\rho$ parameter of the system.

5. The system of claim 1, wherein for each of the plurality of transverse gradient undulator components, the corresponding transverse gradient undulator component is uniformly tilted for the entire length of the corresponding transverse gradient undulator component.

6. The system of claim 1, wherein a spacing between sections of the magnetic undulator is configured to diminish an impact of an FEL action on electron beam parameters.

7. The system of claim 1 further comprising, one or more magnets configured to laterally disperse electrons of the electron beam according its energy before entering the magnetic undulator.

8. The system of claim 1, wherein EUV FEL of the system is operated in an exponential gain region of a FEL gain curve.

9. The system of claim 1, wherein the electron beam is in a steady state.

10. The system of claim 9, wherein the steady state is reached between a cooling of the electron beam in the compact storage ring and a heating of the electron beam due to incoherent and FEL processes.

11. The system of claim 1, wherein FEL radiation is initiated via Self Amplified Stimulated Emission.

12. The system of claim 1, wherein FEL radiation is initiated using an external separate coherent EUV source.

13. The system of claim 1, wherein a portion of the output FEL radiation is seeded back to the compact electron storage ring.

14. The system of claim 13, wherein the portion of the output FEL radiation seeded back to the compact electron storage ring is delayed by a multiple of a revolution time of the electron beam around the compact electron storage ring.

15. The system of claim 13, wherein based on an inverse of a total gain of the FEL radiation, the seeded portion of the output FEL radiation is selected to reach a steady state.

16. The system of claim 15, wherein a power, an intensity or a parameter of the seeded portion of the output FEL radiation is selected or adjusted to maintain the inverse relationship of the total gain of the FEL radiation required to reach the steady state.

17. The system of claim 1, wherein a number of electron bunches stored in the compact storage ring is adjusted and set to achieve a desired total output power.

18. The system of claim 1, wherein for a portion of a plurality of times the electron beam passes through the magnetic undulator, the electron beam is steered within the magnetic undulator to reduce the emission of the FEL radiation during the portion of the plurality of times the electron beam passes through the magnetic undulator.

19. The system of claim 1, wherein the output portion of the FEL radiation is provided to the lithography system via a mirror.

20. The system of claim 1, wherein the system is installed in a semiconductor fabrication facility.

21. A method for producing a high power extreme ultraviolet (EUV) beam, including:
  injecting an electron beam in a compact electron storage ring configured for emission of free-electron laser (FEL) radiation, wherein a circumference of the compact electron storage ring is less than 60 meters, and the compact electron storage ring includes a plurality of bending magnets and a plurality of quadrupole magnets interspersed along the compact electron storage ring, and at least a corresponding one of the quadrupole magnets is between any two of the bending magnets along the compact electron storage ring;
  passing the electron beam through a magnetic undulator on each of a plurality of successive revolutions of the electron beam around the compact electron storage ring, wherein the electron beam is induced to microbunch and radiate coherently while passing through the magnetic undulator, and the magnetic undulator is a transverse gradient undulator that includes a plurality of transverse gradient undulator components and each of the transverse gradient undulator components includes a periodic structure of mechanically coupled set of magnetic components with alternating poles that create alternating transverse magnetic fields along at least a portion of a length of the transverse gradient undulator to generate at least a portion of the free-electron laser radiation when the electron beam travels along at least the portion of the length of the transverse gradient undulator, and for each of the plurality of transverse gradient undulator components, the included corresponding mechanically coupled set of magnetic components with alternating poles is uniformly tilted in a transverse direction to a path of the electron beam; and
  outputting a portion of the free-electron laser radiation at an extreme ultraviolet wavelength produced by an interaction of the electron beam through the magnetic undulator, wherein the output portion of the free-electron laser radiation is provided to a lithography system as a light source for the lithography system and an average power of the output portion of the free-electron laser radiation is greater than 250 W.

* * * * *